United States Patent [19]
Carson et al.

[11] Patent Number: 6,125,158
[45] Date of Patent: Sep. 26, 2000

[54] PHASE LOCKED LOOP AND MULTI-STAGE PHASE COMPARATOR

[75] Inventors: Dave Carson, Nepean; Alan Dunne, Ottawa, both of Canada; Matthew Vea, Rowlett, Tex.; Scott Guest, Raleigh, N.C.; Robert Wyatt, Carp, Canada

[73] Assignee: Nortel Networks Corporation, Montreal, Canada

[21] Appl. No.: 08/996,771

[22] Filed: Dec. 23, 1997

[51] Int. Cl.[7] .............................. H03D 3/24; H04L 7/00; H04L 25/00; H04L 25/40

[52] U.S. Cl. ..................... 375/376; 375/371; 375/373; 375/374; 375/375; 375/327; 327/156; 327/158; 327/159; 327/236; 327/244; 331/10; 331/11; 331/25

[58] Field of Search ..................... 375/376, 371, 375/373, 375, 327, 374; 327/159, 158, 156, 236, 244; 331/25, 10, 11

[56] References Cited

U.S. PATENT DOCUMENTS

| | | |
|---|---|---|
| 4,280,104 | 7/1981 | Rzeszewski .................. 331/1 |
| 4,672,447 | 6/1987 | Moring et al. .................. 358/148 |
| 5,486,792 | 1/1996 | Girardeau, Jr. .................. 331/10 |
| 5,499,274 | 3/1996 | Brown .................. 375/376 |
| 5,604,775 | 2/1997 | Saitoh et al. .................. 375/376 |
| 5,691,669 | 11/1997 | Tsai et al. .................. 331/17 |
| 5,870,002 | 2/1999 | Ghaderi et al. .................. 331/17 |
| 5,875,163 | 2/1999 | Kuroda et al. .................. 369/50 |

*Primary Examiner*—Stephen Chin
*Assistant Examiner*—Michael W. Maddox

[57] ABSTRACT

The disclosure describes a multi-stage phase comparator and a phase-locked loop incorporating such a comparator. The comparator measures a phase difference between a reference signal and an output signal using a periodic clock. The comparator is a two stage comparator comprising a fine and coarse comparator. The coarse comparator measures the number of full clock periods between a transition of the reference signal and the output signal. The fine comparator comprises a delay line generator that generates a plurality of delayed clocks. The delayed clocks are used to over sample the reference signal to determine a fine phase difference representing a remaining fraction of the clock period, between transitions of the reference and output signals. A phase locked loop using the multi-stage comparator allows for more accurate phase locking.

35 Claims, 8 Drawing Sheets

PHASE LOCKED LOOP AND MULTI-STAGE PHASE COMPARATOR

FIELD OF THE INVENTION

The present invention relates to phase comparators, and more particularly to a phase locked loop having a multi-stage digital phase comparator, allowing for accurate phase comparison between an input signal and a reference signal, and hence improved phase locking.

BACKGROUND OF THE INVENTION

Electronic phase locked loops ("PLL"s) are well known and understood. Typically, a PLL comprises a variable frequency oscillator ("VFO") connected in feedback to a phase comparator. The phase comparator generates a signal proportionate to the phase difference between the fed-back output of the VFO and an external periodic reference signal. The frequency of the VFO is varied in direct response to the output of the phase comparator, to reduce this phase difference. Accordingly, the VFO maintains a desired average frequency locked to the frequency of the reference signal. However, the VFO will experience short term variations of phase and frequency as it "hunts" for the underlying frequency of the reference signal.

Typically, PLLs are used to synchronized the distinct clocks of two or more circuits, in frequency and phase. As well, PLLs may be used as frequency synthesizers, multipliers or dividers, and to demodulate phase or frequency modulated signals.

Many applications may require the generation of a digital signal representative of the phase difference generated by a phase comparator. Such a digital representation is desirable for generating a digital version of a demodulated signal, or for controlling a VFO. Moreover, a digital phase comparator is particularly useful in a digital phase locked loop, that locks two or more digital (ie. square wave) clocks.

Numerous phase comparators providing a digital output signal are known. One known comparator uses an analog to digital converter to convert a sensed analog phase difference into a digital signal. In order to achieve any significant accuracy, however, a phase comparator whose output is extremely well matched to the input of an associated analog to digital converter must be used. This typically requires a very linear phase comparator and a well matched voltage conversion factor from the comparator to the analog to digital converter.

Another comparator uses a locally generated digital reference clock having a fixed period. The clock is used to measure the time difference, in reference clock cycles, between transitions of the signals to be compared. A digital counter counts the number of elapsed reference clock periods between a transition of a first input signal, and a second input signal. As will be appreciated, the accuracy of such a comparator is directly related to the frequency of the reference clock. The measured phase difference will be quantized, in quanta proportional to the reference clock period. This naturally results in a quantization error that may be as great as a reference clock period. Obviously, improved accuracy and a reduced quantization error may be achieved by increasing the frequency of the reference clock. This solution, however, requires greater circuit complexity and tolerances to accommodate higher frequency signals. Moreover, the resulting signals require and dissipate more power.

Certain digital applications require extremely precise frequency synchronization and are therefore very susceptible to the errors associated with using PLLs incorporating either of the above phase comparators. Digital telephone switches in the public telephone network, for example, process bytes of pulse code modulated ("PCM") voice data sampled at a frequency of 8000 Hz. Switches are hierarchically arranged in strata, and switches in one stratum are synchronized to switches in the stratum, hierarchically above them. As the synchronization is hierarchical slight synchronization errors may propagate from switches in higher strata to switches in lower strata.

Using PLLs incorporating the above described comparators with their associated inaccuracies, may produce phase and frequency discrepancies in the network, resulting in errors.

The present invention attempts to overcome some of the disadvantages associated with known phase comparators and PLLs utilizing such comparators.

SUMMARY OF THE INVENTION

It is an object of the present invention to generate a highly accurate signal representative of a phase difference between two signals.

Advantageously, the invention achieves improved phase comparator accuracy in a comparator using a reference clock, without requiring an increased reference clock frequency.

In accordance with an aspect of the present invention, there is provided a phase comparator for generating a total difference signal representative of a phase difference between an output signal and a reference signal provided to the comparator, comprising a clock source providing a periodic clock signal, having a clock period, and related to the output signal; a coarse phase comparator providing a coarse difference signal by counting a number of complete periods of the clock signal between transitions of the reference and output signals; and a fine phase comparator for producing a fine difference signal representative of a remaining fraction of a clock period between transitions of the reference and output signals; and a signal combiner to combine the coarse and fine difference signals to generate the total difference signal.

In accordance with another aspect of the present invention there is provided a phase locked loop for generating an output signal phase locked to a reference signal, comprising a phase comparator, for generating a difference signal representative of a total phase difference between the reference signal and the output signal; a variable frequency oscillator connected to the phase comparator to receive the difference signal, the oscillator adapted to generate a clock signal related to the output signal and having a frequency that varies for a non-zero phase difference signal; an output source for providing the output signal, phase locked to the clock signal, the output source interconnected with one of the comparator and the oscillator; the phase comparator comprising a coarse phase comparator providing a coarse difference signal by counting a number of complete periods of the clock signal between transitions of the reference signal and the output signal; a fine phase comparator providing a fine difference signal representative of a remaining fraction of a clock period between transitions of the reference and output signals; and a signal combiner to combine the coarse and fine difference signals to generate the total difference signal.

In accordance with a further aspect of the present invention there is provided a method of determining the phase difference between a first input signal and a second signal, comprising the steps of; generating a periodic clock signal having a clock period less than a period of the first input signal; counting a number of full clock periods between a transition of the first input signal and the second signal; estimating a remaining fraction of a clock period between the transitions of the first input signal and the second signal.

In accordance with yet another aspect of the present invention there is provided a digital phase comparator for generating a difference signal representative of a phase difference between first and second periodic input signals, the comparator comprising, a clock source providing a periodic clock signal, having a frequency greater than the first and second input signals; a coarse comparator providing an output signal based on a number of full periods of the clock signal between a transition of the first and second input signals; a fine phase comparator for producing an output signal representative of a remaining fraction of a clock period between transitions of the first and second input signals; a signal combiner to combine the output signals of the fine and coarse comparators to form the difference signal.

In accordance with yet a further aspect of the present invention there is provided a phase comparator for generating a total difference signal representative of a phase difference between first and second periodic input signals, the comparator comprising, means for providing a periodic clock signal, having a frequency greater than the first and second input signals; means for producing a first difference signal representative of a number of full periods of the clock signal between transitions of the first input signal and the second input signal; means for producing a second difference signal representative of a remaining fraction of a clock period between transitions of the first and second input signals; means for combining the first and second difference signals to form the total difference signal.

BRIEF DESCRIPTION OF THE DRAWING

In figures which illustrate, by way of example, embodiments of the present invention.

DETAILED DESCRIPTION

Figure 1:
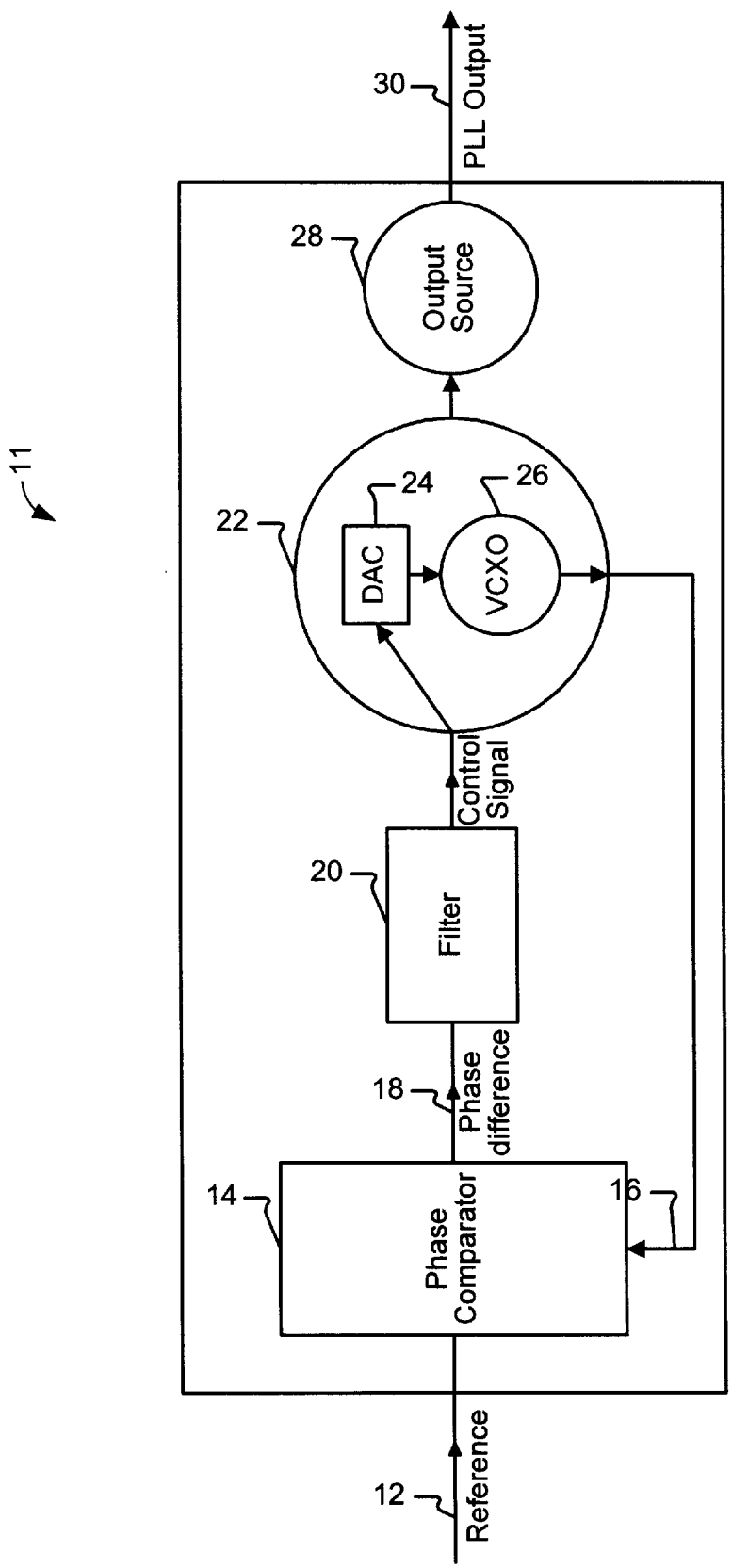
FIG. 1 is a block diagram of a PLL in accordance with an aspect of the present invention.

FIG. 1 illustrates in block diagram a PLL 11, exemplary of a preferred embodiment of the present invention. PLL 11 takes a reference signal at input 12 and generates a PLL output signal at output 30. PLL 11 comprises phase comparator 14, having first and second comparator inputs 12 and 16, and an output 18. Interconnected to output 18 is a digital input of a software filter 20 that provides a digital output.

The output of filter 20 is connected to the control input of a controlled variable frequency oscillator 22. The output of oscillator 22 is fed-back to phase comparator input 16. Output source 28 is also interconnected with oscillator 22, and generates an output signal at output 30. The output signal is derived from and phase locked to the signal fed-back to comparator input 16.

Oscillator 22 comprises digital to analog converter ("DAC") 24, having an analog output connected to a variable frequency, voltage control crystal oscillator ("VCXO") 26. Input of DAC 24 is connected to output of filter 20. Oscillator 22 is designed to generate a periodic signal having a variable frequency at or near an integer multiple of a periodic reference signal presented at comparator input 12. The periodic signal is used as a clock signal for phase comparator 14.

Output source 28 may, for example, be a simple frequency divider that divides the frequency of the output signal of VCXO 26 to produce a PLL output signal at output 30. When the PLL 11 is "locked", the output frequency of a signal at output 30 will be identical to the reference frequency at input 12. As will become apparent, output source 28 may be connected to comparator 14.

Comparator 14 is a two stage comparator. It generates a sixteen bit digital signal at output 18 representative of the phase difference between the reference signal at input 12 and a PLL output signal at output 30. This comparator output signal is presented to digital filter 20 that generates a digital output signal to be provided to DAC 24. Filter 20 may be a digital equivalent of an analog low pass filter, implemented in software as a part of a conventional microcontroller (not shown).

DAC 24, of oscillator 22 generates at its output an analog voltage in response to the digital input from filter 20. The output of DAC 24 is connected to VCXO 26. The frequency of VCXO 26 varies in direct response to the analog voltage output of DAC 24. VCXO 26 provides an input signal at phase comparator input 12. As well, oscillator 22 may be used to provide a clock signal for a larger system interconnected to PLL 11.

The microcontroller (not shown) embodying filter 20 may additionally be adapted to adjust output of filter 20 presented to DAC 24, in response to certain sensed conditions. For example, in the event that the input of filter 20 deviates wildly from a predicted state, the microcontroller may simply not provide an updated output to DAC 24, thereby maintaining the previous input to DAC 24. Moreover, in the event that the input of filter 20 suddenly drops to zero, the microcontroller may delay adjustment of the signal provided to DAC 24 until the cause of the output transition is diagnosed.

In the preferred embodiment, PLL 11 is used to synchronize two network elements forming part of the public switched telephone network. As such, reference signal at input 12 will have a frequency of 8000 Hz. VCXO 26 is adapted to oscillate about a frequency 4096 times as high, at 32.768 MHZ. The control input of VCXO 26 takes a voltage signal between 0.5 V and 4.5 V. The VCXO 26 oscillates at its center frequency of 32.768 MHZ in the presence of 2.5 V at its control input. VCXO 26 may vary in frequency by +/−50 parts per million. Output source 28 may simply comprise a frequency divider that divides the frequency of VCXO 26 by 4096. A telephone network element including PLL 11 may use VCXO 26 as a clock generator for generating an internal clock signal at about 32.768 MHz.

Figure 2:
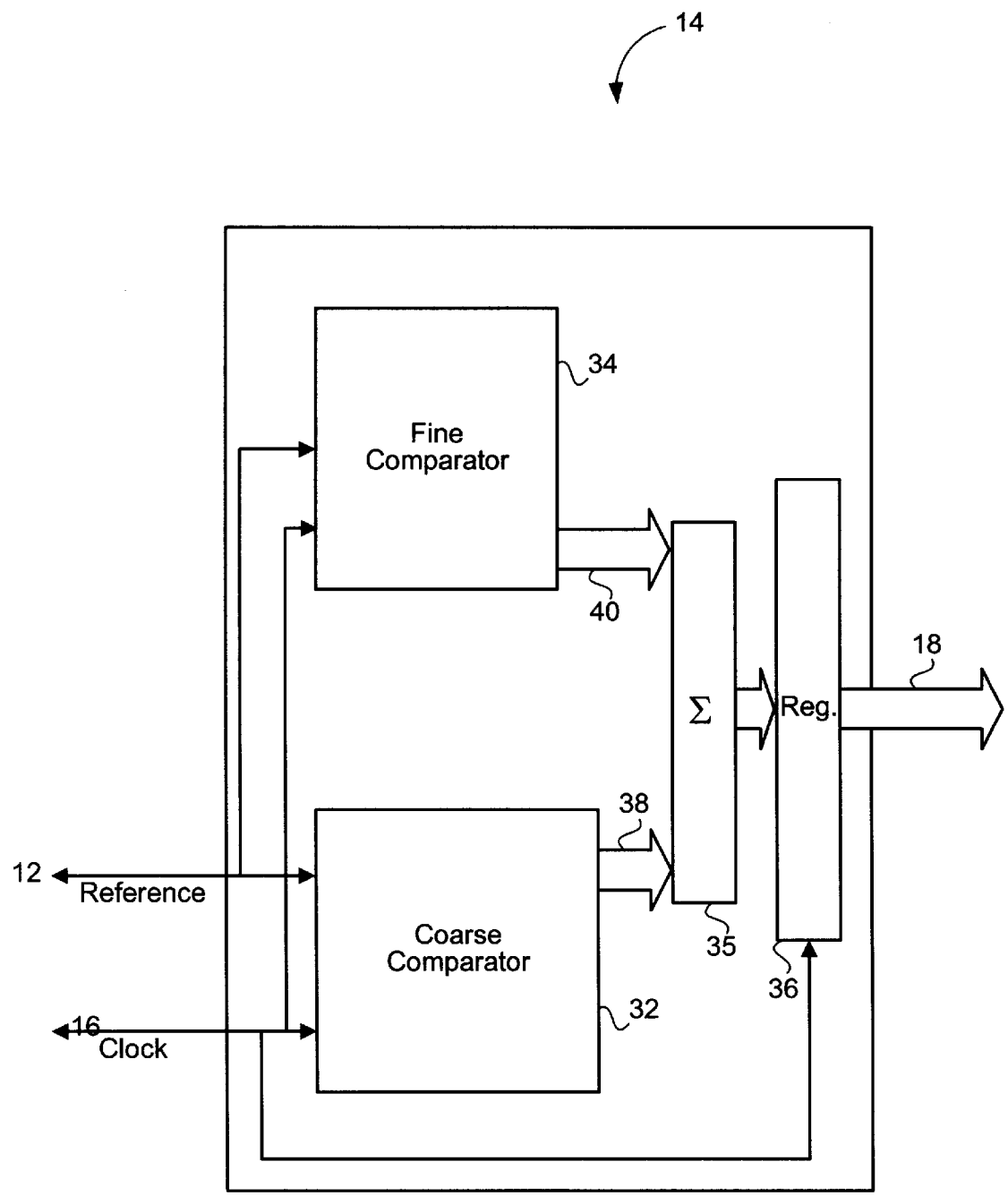
FIG. 2 is a block diagram of a phase comparator forming part of the PLL of FIG. 1.

FIG. 2 further illustrates, in block diagram, phase comparator 14 of PLL 11. Phase comparator 14 comprises a coarse comparator 32, a fine comparator 34, an adder 35 and a sixteen bit digital register 36. Phase comparator 14 takes as its inputs, signals at reference input 12 of PLL 11 and input 16. Coarse comparator 32 presents at its output 38 a sixteen bit digital signal representative of the phase difference between transitions of a reference signal at reference input 12 and a PLL output signal at output 30. This coarse phase difference is measured in periods of a clock signal at input 16. Transitions are measured on the rising edge of signals at inputs 12, 16 and output 30.

Fine comparator 34 presents at its output 40 a three bit digital signal representative of a phase difference between a transition of a reference signal at input 12 and a transition of a clock signal at input 16, measured in fractions of a period of the clock signal. Adder 35 and register 36 act as a combining circuit to combine outputs 40 and 38. Specifically, adder 35 adds the sixteen and three bit digital outputs 38, 40 of coarse and fine comparators 32 and 34 to form a sixteen bit signal presented to register 36. The output of adder 35 is loaded into output 18 of register 36, upon a transition of clock signal at input 16.

Figure 3:
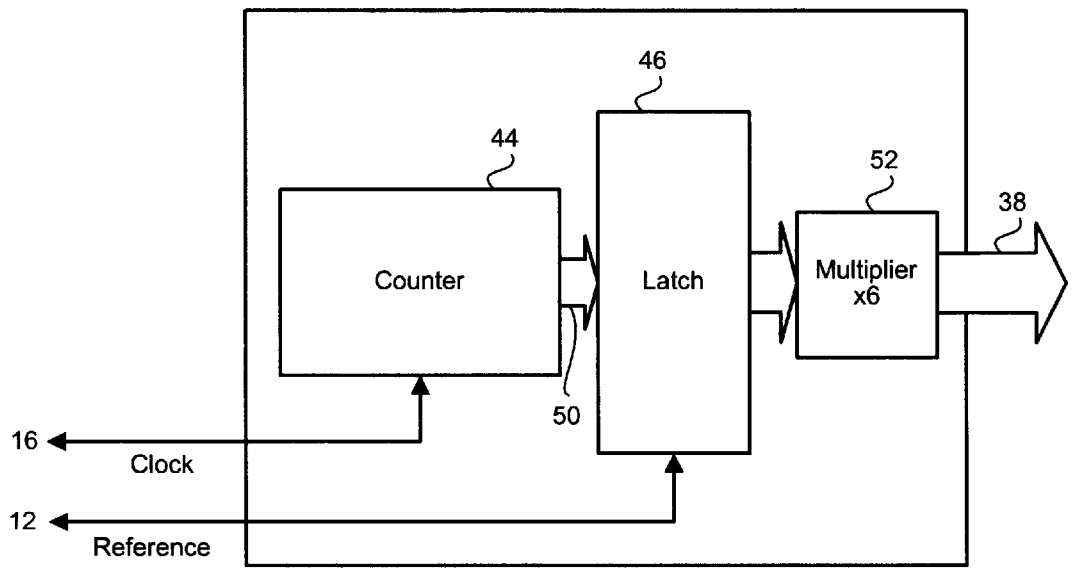
FIG. 3 is a block diagram of a coarse phase comparator forming part of the phase comparator of FIG. 2.

FIG. 3 illustrates in block diagram, coarse comparator 32. Coarse comparator 32 comprises a twelve bit digital counter 44 taking as its inputs, the clock signal at input 16. Counter 44 is always enabled. As well, coarse comparator 32 comprises a latch 46 and a digital multiplier 52. Counter 44 is a twelve bit cyclic counter that increments on the rising edge of a clock signal at input 16, once with each period of clock signal. Conveniently, counter 44 counts from 0 to $2^{12}-1$ or from 0 to 4095. Thus, when PLL 11 is "locked" to an input signal having a frequency of 8000 Hz, counter 44 counts one entire cycle (0–4095) during one 125 µs period of the signal at input 12. Latch 46 takes as its input 50 the output twelve bit value of counter 44. Latch 46 also takes as its trigger input the reference signal at input 12. Latch 46 "latches" the value of the counter at its input at its output 38 in response to the transition of the reference signal at input 12. Multiplier 52 takes at its input the twelve bit output of latch 46, multiplies it by factor of six, and presents a sixteen bit value its output at output 38. Of course, multiplier 52 could be integrated with counter 44, which could in turn count from 0–4095×6 in increments of six.

Figure 4:
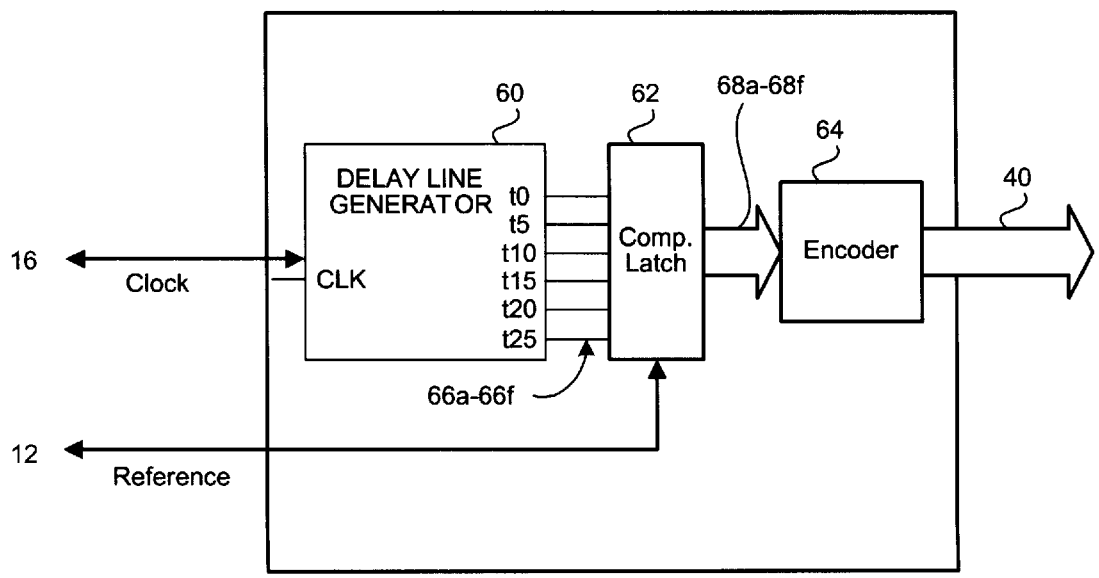
FIG. 4 is a block diagram of a fine phase comparator forming part of the phase comparator of FIG. 2.

FIG. 4 illustrates, in block diagram, fine comparator 34. Fine comparator 34 comprises a delay line generator 60; a composite latch 62; and an encoder 64. Outputs 66a–66f of delay line generator 60 are interconnected to composite latch 62, which further takes as its input the reference signal at input 12. Delay line generator 60, takes at its input a clock signal at comparator input 16, and generates at its outputs 66a–66f, time delayed versions of the clock signal, each having a delay of a fraction of the period of the clock signal. In the preferred embodiment, the period of the clock signal is approximately 30.5 ns, corresponding to a frequency of 32.768 MHz. Delay line generator 60 generates signals at outputs 66a–66f having delays of approximately zero, five, ten, fifteen, twenty and twenty five nanoseconds, respectively. Composite latch 62 samples a signal at input 12 using the delayed clock signal, and latches and encodes the sample values.

Specifically, upon a transition of each delayed clock signal at delay line generator outputs 66a–66f, the signal at input 12 is sampled. The samples are encoded and latched at outputs 68a–68f. Outputs 68a–68f are connected to inputs of encoder 64, which produces at its output 40, an encoded three-bit digital output provided to adder 35 (FIG. 2). Latched outputs 68a–68f will be indicative of a phase difference between the transition of a clock signal at input 16 and the transition of a reference signal at input 12. Latching by composite latch 62, however, is not instantaneous. Specifically, composite latch 62 introduces a minimum delay of 3.5 clock cycles. Therefore, outputs 68a–68f are indicative of a phase difference between the transition of a clock signal at input 16 and the transition of a reference signal at input 12 as measured 3.5 clock cycles earlier. Register 36 (FIG. 2) loads the values at outputs 66a–66f as delayed and encoded at outputs 68a–68f when a transition of the signal at input 12 is sampled using the zero delayed clock at output 66a.

Figure 5:
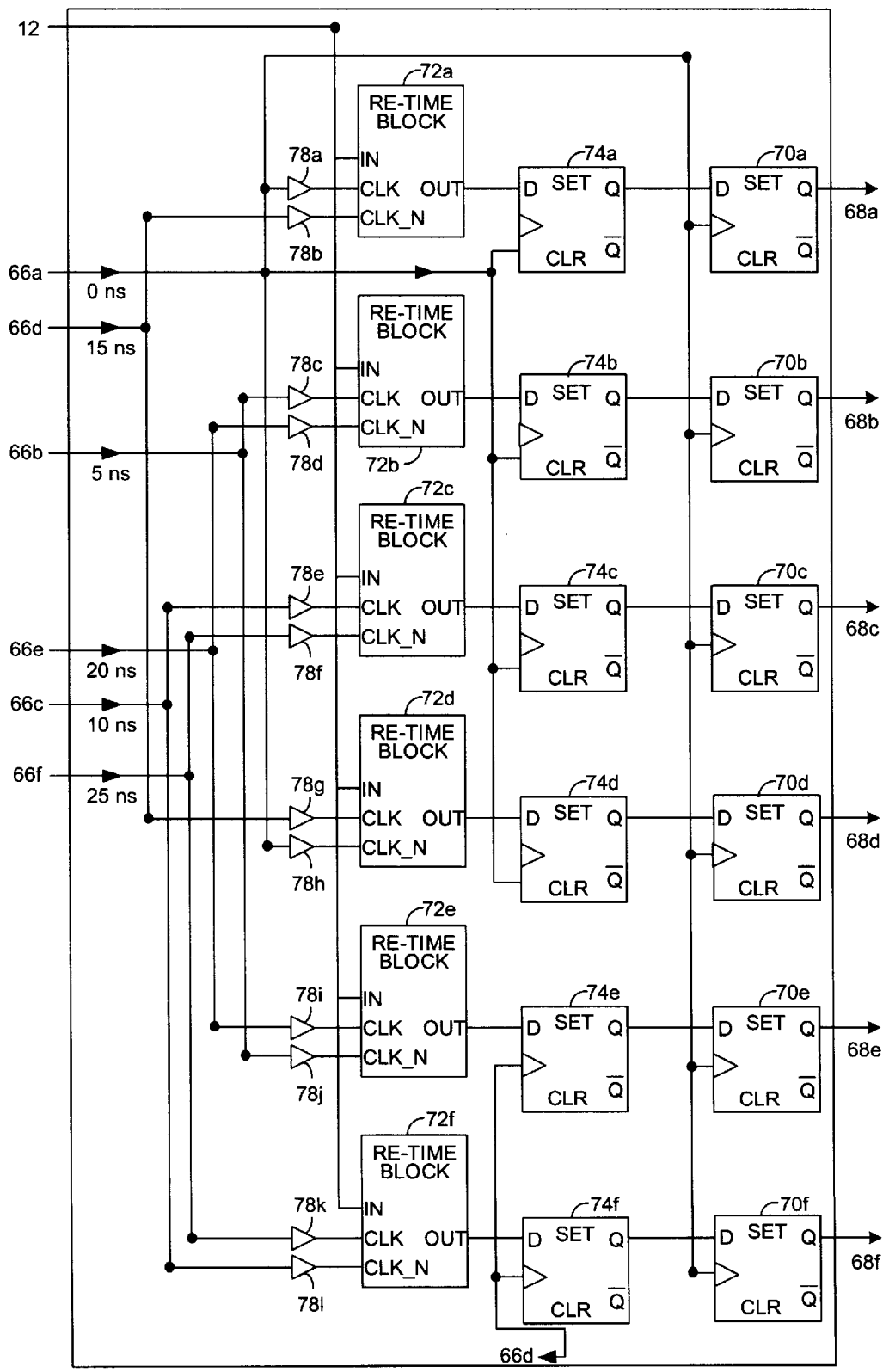
FIG. 5 is a block diagram a composite latch forming part of the fine comparator of FIG. 2.

FIG. 5 is a detailed block diagram of composite latch 62. Composite latch 62 takes at its inputs, clock delay line outputs 66a–66f and a reference signal at input 12. Composite latch 62 comprises twelve D-type output flip-flops 70a–70f and 74a–74f as well as six re-time blocks 72a–72f. Inputs to re-time blocks 72a–72f are buffered by conventional digital buffers 78a–78l. Outputs of re-time blocks 72a–72f are interconnected to D inputs of flip-flops 74a–74f. Outputs of flip-flops 74a–74f are interconnected with the D-inputs of flip-flops 70a–70f, respectively.

Figure 6:
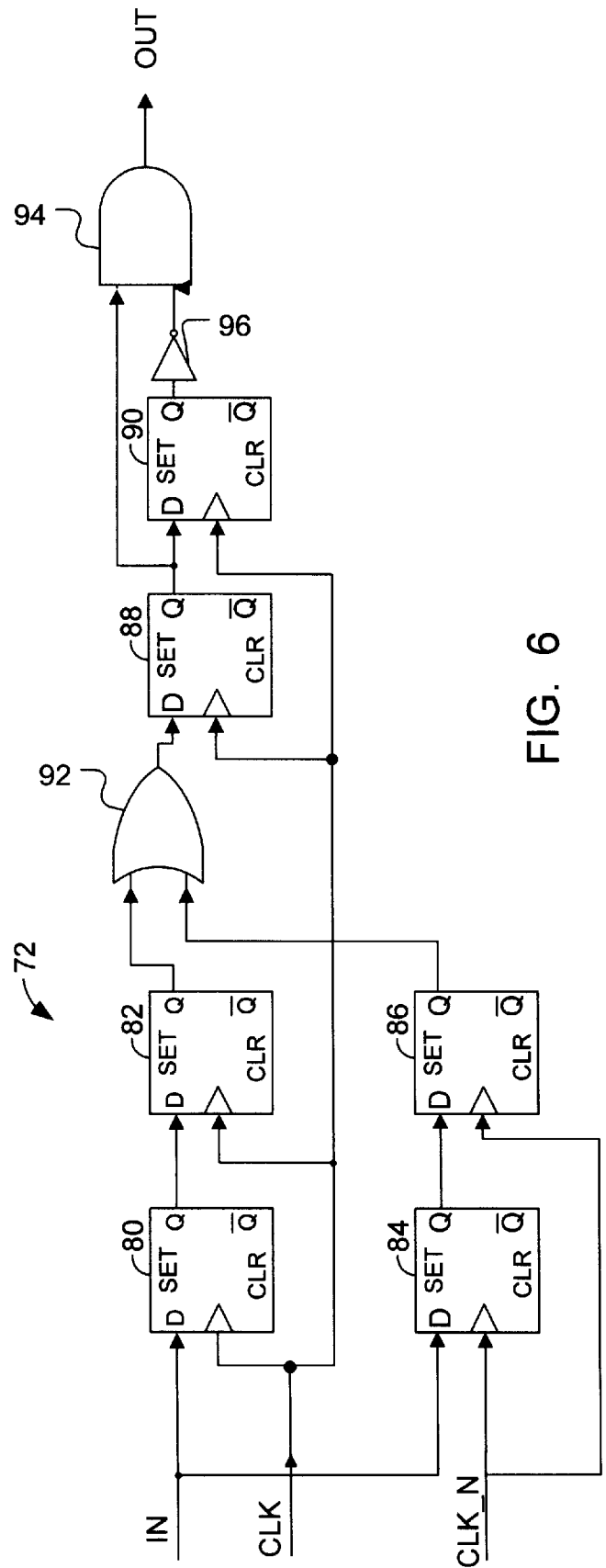
FIG. 6 is a schematic diagram of a re-time block used in the composite latch of FIG. 5.

FIG. 6 illustrates the architecture of each retime block 72a–72f, labelled generally as 72. Re-time blocks 72a–72f are identical. Each re-time block 72 takes at its inputs the reference signal at input 12 (FIG. 1), and clock pulses and inverted clock pulses generated by delay line generator 60. Each re-time block 72 converts these inputs to pulses that are introduced to flip-flops 74a–74f (FIG. 5). The clock signals for the flip-flops 74a–74f are chosen to ensure that the signals generated by re-time blocks 72a–72f are valid when sampled.

As well, re-time blocks 72 simple the reference signal at input 12 by two sets of two flip flops (80,82 and 84,86). One set of flip-flops 80,82 is driven by a first clock signal generated by delay line generator 60 (FIG. 4); the other set 84,86 is driven by a complementary clock signal delayed by 15 nanoseconds, also generated by delay line generator 60. For example, as illustrated in FIG. 5, re-time block 72a is driven by clock signals delayed by zero and fifteen nanoseconds, generated at outputs 66a and 66d of delay line generator 60 (FIG. 4). Sampling the signal at input 12 with flip-flops triggered by clock and complementary clock signals, spaced by fifteen nanoseconds guarantees that an input pulse width greater than fifteen nanoseconds will be captured. Comparator 14 is thus designed to a clock signal minimum pulse width of approximately fifteen nanoseconds.

Pairs of flip flops (80,82 and 84,86) are also used to reduce the possibility of meta-stability. As will be appreciated, if the signal at the D input of a flip flop changes just prior to the rising edge of the clock input, the Q output will be unknown for a finite time period. This is a possibility in composite latch 62 since the reference signal at input 12 may be asynchronous to the clock signals driving flip-flop 80–86 of each re-time block 72a–72f. By sampling the output of flip-flop 80 with flip-flop 82 and the output of flip-flop 84 with the output of flip-flop 86, the probability of meta-stability is reduced.

The outputs of flip-flops 82 and 86 are ORed at OR-gate 92. The output of gate 92 is drives inputs of flip flops 88 and 90. The output of flip-flop 90 is inverted by inverter 96 and logically ANDed at AND-gate 94 with the output of flip-flop 88. This will generate a frame pulse having a width of 30.5 ns on each rising edge of a signal at input 12.

As illustrated in FIGS. 4 and 5, the outputs of the six re-time blocks are latched into six flip flops 74a–74f. Flip-flops 74a–74f re-time the signal and further reduce the meta-stability to ensure that signals at their outputs are valid when sampled by flip-flops 70a–70f. The outputs of flip flops 70a–70f are encoded into a three bit number by encoder 64. Encoder 64 may comprise conventional logic gates to encode inputs from composite latch 62, to produce outputs as describe below. The three bit number at output 40 of encoder 64 is added to the twelve bit value of counter 44, which has been multiplied by six at output 38. The resulting sixteen bit number is latched into the phase comparator register 36 (FIG. 2).

As will be appreciated, PLL 11 could be formed using conventional, discrete or integrated electronic devices. Alternatively, components such as phase comparator 14 and oscillator 22 could be formed using one or more application specific integrated circuits ("ASIC"s). In a preferred embodiment, all components of phase comparator 14 except delay line generator 60 are formed on a single ASIC. In this embodiment, delay line generator 60 is a commercially available delay line generator as produced and sold by Cypress Semiconductor Corporation, of San Jose, Calif. 95134 as part number CY7B9911 ("RoboClock+"). As noted, filter 20 is a software filter implemented using a conventional microcontroller. DAC 24 is a conventional twelve bit DAC available through Linear Technology Corporation of Milpitas, Calif. 95035, as part number LTC1453. Output source 28 is simply a tap interconnected with comparator 14.

Figures 7, 8:
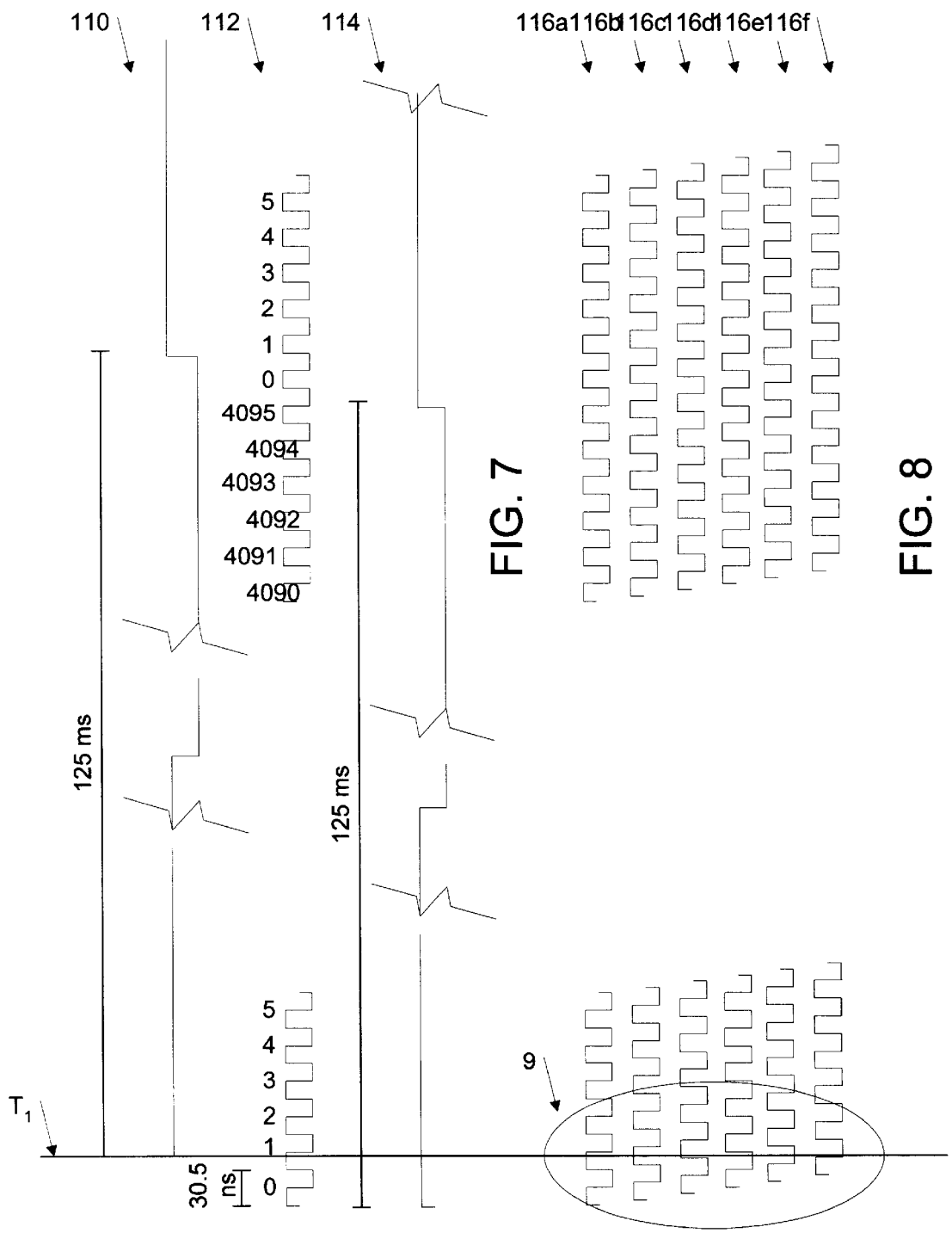
FIGS. 7, 8 and 9 illustrate various signals present in the PLL of FIG. 1, in operation.

In operation, a reference signal 110 as illustrated in FIG. 7 is applied at input 12 of PLL 11. Reference signal 110 has a frequency of 8000 Hz. Oscillator 26 oscillates at a local clock frequency at or near an integer multiple of reference signal 110 to produce clock signal 112 at its output. Clock signal 112 initially has a frequency of approximately 32.768 MHz, a frequency that is 4096 times as great as the frequency of reference signal 110. Clock signal 112 is provided to input 16 of comparator 14 (FIG. 1). The output signal 114 of PLL 11 generated by output source 28 at output 30 is derived from the local clock signal 112, and phase locked thereto. Output signal 114 is derived from clock signal 112 by frequency dividing this signal by 4096 to have a frequency at or near 8000 Hz, the frequency of input signal 110.

Counter 44 (FIG. 3) increments with every rising edge of clock signal 112, generated by oscillator 22. Counter values are illustrated in FIG. 7. The output of counter 44 is continuously provided to the input of latch 46. On a rising edge of a reference signal 110 at input 12, latch 46 captures or latches the value of twelve bit counter 44. The output of latch 46 is provided to multiplier 52. Multiplier 52 generates a sixteen bit output representative of the output of latch 46 multiplied by six. The output 38 of multiplier 52 forms the output of coarse comparator.

For example, at $T_1$ (FIGS. 7–9) counter 44 will have a value of 1, which will be latched at latch 46 of coarse comparator 32. For reasons that will become apparent, this value is multiplied by six at multiplier 52 and presented as a sixteen bit output at coarse comparator output 38.

Figure 9:
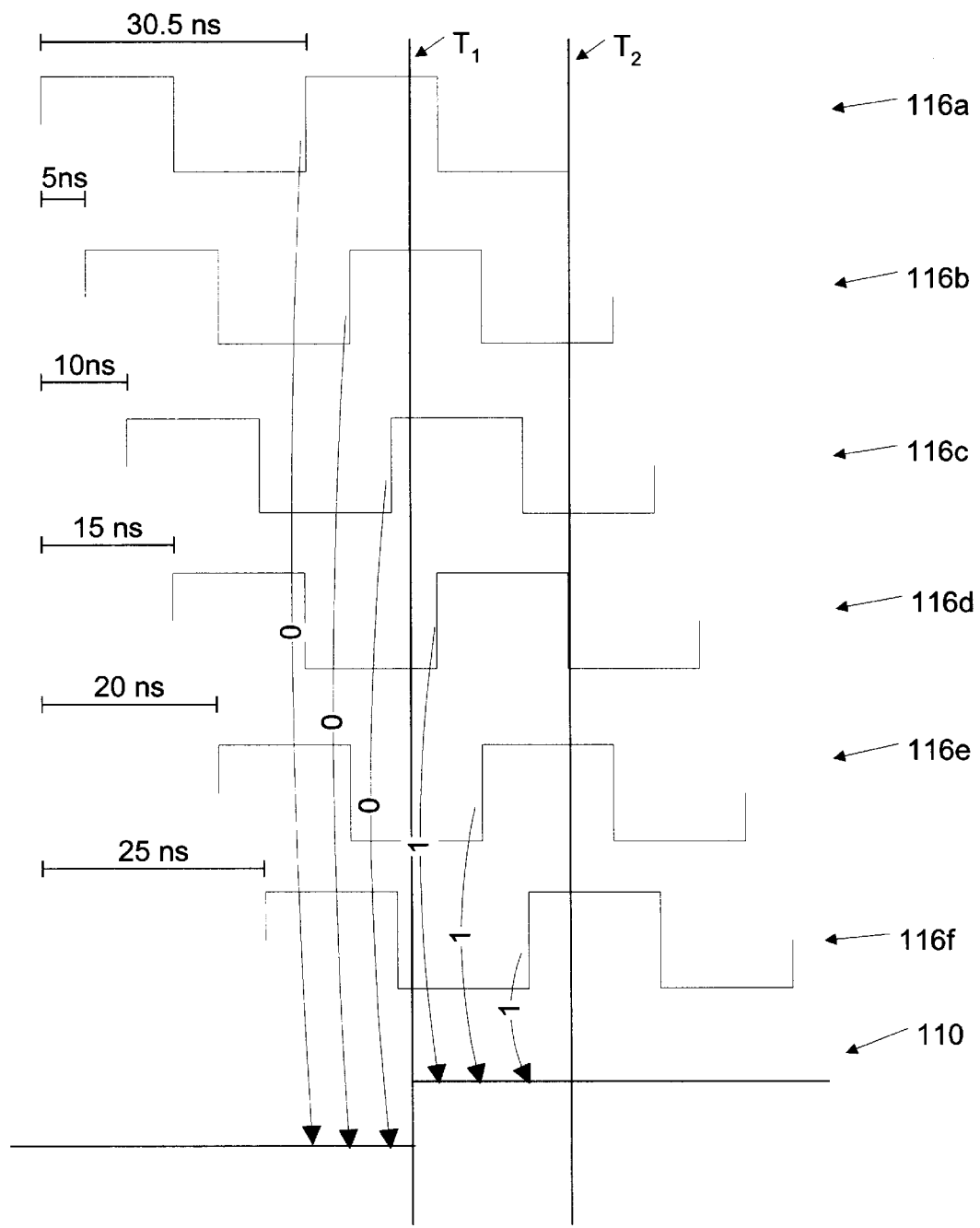

At the same time, as illustrated in FIGS. 8 and 9, clock delay line generator, produces reference signals 116a, 116b, 116c, 116d, 116e and 116f, which are delayed versions of clock signal 112 having delays of approximately zero, five, ten, fifteen, twenty and twenty-five nanoseconds at outputs 64a–64f. These outputs are provided to inputs of composite latch 62 at all times. Composite latch 62 further takes at input reference signal 110 presented at input 12. Each re-time block 72a–72f of composite latch 62 (FIG. 4) samples input signals 110 on each rising edge of a delayed clock signal 116a–116f. The sampled values are encoded by re-time blocks 72 and latched by flip-flops 74a–74f on their respective clocks and again by flip-flops 70a–70f on the rising edge of zero delayed clock 116a.

So for example, at $T_1$ reference signal 110 undergoes a transition evidenced by a rising edge. Flip flop 80 of each re-time block (FIG. 6) will sample the input signal 110 with its corresponding clock signal 116a–116f (CLK). At $T_2$ these samples will have values of 000111 as illustrated in FIG. 9. Similarly flip flop 84 of each re-time block 72 also samples the input signal 110 with its corresponding complementary clock signal (CLK_N). At $T_2$ these samples will have a value of 111000 (not illustrated). These two sets of samples are re-timed to reduce the probability of meta-stability. The remainder of each of re-time blocks 72 converts the sample ot input signal 110 to a one clock period pulse. The six pulses generated by the re-time blocks 72 are combined to produce a six bit wide value at the outputs of flip-flops 70a–70f. In the example of FIG. 9, this six bit value is indicative of a phase difference of between the and fifteen nanoseconds, between the rising edge of clock signal 112 and the rising edge of reference signal 110. It is worth noting that composite latch 62 introduces a delay to the sampled values at flip-flops 70a–70f.

As will be appreciated, the value of the outputs of delay line generator 60 will generally present an indication of the fraction of the period of signal 112 during which a rising edge of reference signal 110 arrives. The outputs of composite latch 62 are suitably encoded by encoder 64 using outputs 68b–68f into a three bit value as illustrated in the following table:

| Sampled reference signal | Time delay | 3 bit encoded value |
| --- | --- | --- |
| 011111 | 0–5 ns | 000 |
| 001111 | 5–10 ns | 001 |
| 000111 | 10–15 ns | 010 |
| 000011 | 15–20 ns | 011 |
| 000001 | 20–25 ns | 100 |
| 000000 | 25–30 ns | 101 |
| Other values | Invalid | Invalid |

The three bit output of encoder 64 is provided to register 36 (FIG. 2) and added to the output of coarse comparator 32. As multiplier 52 (FIG. 3) has multiplied the output of counter 44 by six, the value at output 38 of coarse comparator 32, will have a delayed value representative of the phase difference between the reference signal 110 at input 12 and the output signal at output 30, in five nano-second intervals. For example, at $T_1$, counter 44 will have a value of 1 at its output, indicating a phase difference of one period of a clock signal at input 16 or about 30.5 ns. Output 38 of multiplier 52 will have a value of six, indicative of a coarse phase difference of six, five nano-second intervals. At $T_2$, output 40 of encoder 64 will have a value of three (binary 011). This is added to the value at output 38 by adder 35 (FIG. 2) to form a total value of 9 (binary 1001) at the output 18 of register 36, indicative of a phase difference of approximated 30.5 ns+15 ns=45 ns=9×5 ns.

Thus shortly after a transition of a signal at input 12, output 18 of register 36 will contain a sixteen bit value, indicative of the value of counter 44 (provided by coarse comparator 32) multiplied by six added to the output of encoder 44. As will be appreciated, this output is a quantized representation of a phase difference between reference signal at input 12 and a signal at output 30, quantized in five nano-second intervals.

The sixteen bit value at output 18 of register 36 is provided to filter 20, where it is processed to provide an input to DAC 24. Filter 20 is the equivalent of a low pass filter and eliminates the equivalent of any AC component in an analog equivalent of the signal provided to DAC 24, and further calculates i new output value to provide to DAC, based previous values provided to DAC 24. Essentially, if output of register 36 indicates the equivalent of a negative phase difference between the output signal at output 30 and the reference signal at input 12, filter 20 provides a signal to DAC 24 to increase the frequency of VCXO 26. In response, DAC 24 provides an analog output voltage to VCXO 26 to increase its frequency. Similarly, if the output of register 36 indicates a positive phase difference, the input to DAC 24 is adjusted so its analog output reduces the frequency of VCXO 26. Once the value at output 18 is zero, filter 20 maintains the input value of DAC 24 so that the frequency of VCXO 26 is not varied. All sixteen bits at output 18 are used to adjust the filter value provided to DAC 24. Accordingly, the frequency of VCXO 26 is varied to have a period within 5 ns of the period of the signal at reference input 12.

If the reference signal at input 12 should drift slightly in frequency or phase, sixteen bit output of register 18 will reflect the presence of a phase difference between the signals at input 12 and output 30. VCXO 26 will be adjusted accordingly to reduce this phase difference.

As will be appreciated, the use of coarse and fine comparators 32 and 34 allow for the production of a sixteen bit difference signal at output 18, representative of a phase difference in five nanosecond quanta, measured using a clock signal having a period of 30.5 ns. Conventional digital phase comparators may achieve similar phase accuracy using a clock signal having a period of five nanoseconds or a frequency of 6×32.768 MHZ=196.608 MHZ.

As should now be apparent, output source 28 could easily be interconnected to counter 44 of phase comparator 14, to produce an output signal that oscillates once with every complete cycle of counter 44.

Figure 10:
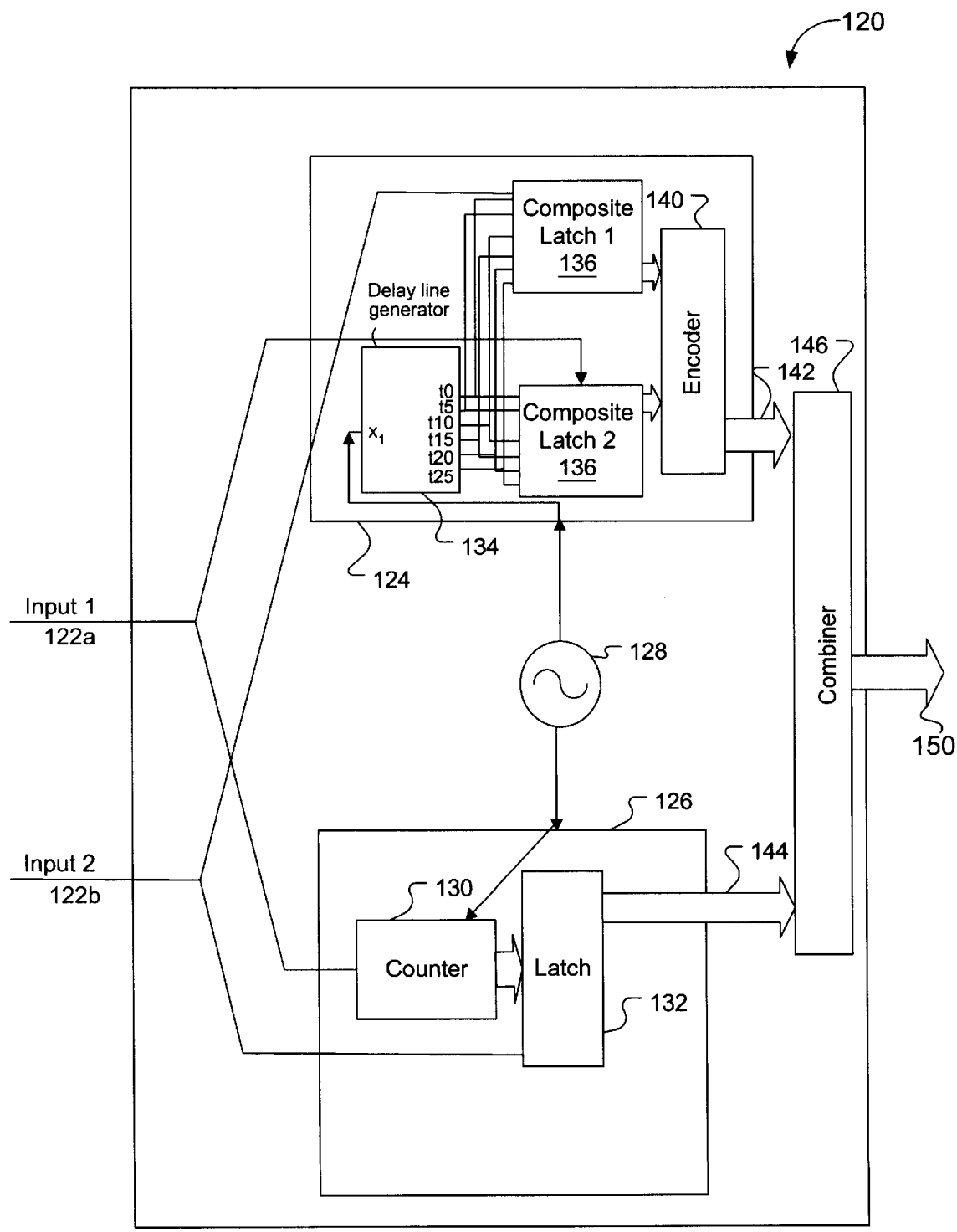
FIG. 10 is a block diagram of a phase comparator in accordance with another aspect of the present invention.

FIG. 10 illustrates phase comparator 120, exemplary of a second embodiment of the present invention. Comparator 120 is similar to comparator 14. However, comparator 120 is adapted to generate an output representative of a phase difference between a first and second input signals, presented at inputs 122a and 122b using an internally generated clock signal.

Specifically, phase comparator 120 comprises fine comparator 124 and coarse comparator 126, similar to comparators 32 and 34 of FIGS. 2–4. However, comparator 120 comprises its own internal clock source 128. Clock source 128 is adapted to oscillate at a frequency significantly higher than that of signals to be presented at inputs 122a and 122b. Preferably, clock 128 will generate a clock signal that is an integer multiple of a periodic signal at one of inputs 122a and 122b. The clock signal generated by clock source 128 is provided to both fine and coarse comparators 124 and 126. Moreover both fine and coarse comparators 124 and 126 receive both input signals at inputs 122a and 122b at output 150.

Coarse comparator 126 comprises a counter 130 driven by clock source 128 and a latch 132. Counter 130, however, is reset and activated upon sensing a transition of an input signal at input 122a, and increments with every rising edge of a clock signal generated by clock source 128. Latch 132 latches the output of counter 130 upon sensing a transition of an input at input 122b. Thus the latched value in latch 132 will be indicative of the number of clock cycles of the clock signal generated by clock source 128 between a transition of signals at inputs 122a and 122b. This value is presented at coarse comparator output 144.

At the same time, fine comparator 124 captures the phase difference between the clock signal generated by source 128 and a signal at input 122a using a delay line generator 134 and composite latch 136 using at method analogous to that used by fine comparator 34. Similarly the comparator 132 captures a second fine phase difference between the clock signal generated by source 128 and a signal at input 122b using a delay line generator 134 and composite latch 138 using a method analogous to that used by fine comparator 34. The latched first and second fine phase differences are combined and encoded by encoder 140 to provide a fined phase difference in fractions of a period of a clock signal generated by clock source 128 at output 142.

Combiner 146 combines output 142 and 144 to present a signal indicative of a total phase difference between signals at inputs 122a and 122b.

It is worth noting that comparator 14 of FIGS. 2–4 require only one composite latch 62 (FIG. 4) and a continuously running counter 44 (FIG. 3). This is because the clock signal used by comparator 14, presented at input 16 is phase locked to the output signal at output 30. In the embodiment of FIG. 10 clock source 128 produces an entirely asynchronous clock signal.

It will be apparent that numerous modifications to the above embodiments are possible. For example, the PLL 11 may easily be adapted to lock to input frequencies other than 8000 Hz. Similarly, phase comparators 14 and 120 could easily be adapted to digitally measure phase differences between analog signals.

Fine phase comparator 34 has been described as sampling an input signal at transitions of delayed clock signals. However, delayed clock signals could easily be sampled at the transition of the input signal to produce a similar fine phase difference.

It will be understood that the invention is not limited to the described embodiments which are merely illustrative of preferred embodiments of carrying out the invention, and which are susceptible to modification of form, arrangement of parts and details of operation. A person skilled in the art will appreciate that a large number of design alternatives to the described embodiment are possible. The invention, rather, is intended to encompass all such modification within its spirit and scope, as defined by the claims.

We claim:

1. A phase comparator for generating a total difference signal representative of a phase difference between an output signal and a reference signal provided to said comparator, comprising
 a clock source providing a periodic clock signal, having a clock period, and related to said output signal;
 a coarse phase comparator providing a coarse difference signal by counting a number of complete periods of said clock signal between transitions of said reference and output signals;
 a fine phase comparator for producing a fine difference signal representative of a remaining fraction of a clock period between transitions of said reference and output signals;
 a signal combiner to combine said coarse and fine difference signals to generate said total difference signal.

2. The phase comparator of claim 1, wherein said clock signal is phase-locked to said output signal.

3. The phase comparator of claim 2, wherein said fine, coarse and total difference signals are digital signals.

4. The phase comparator of claim 3, wherein said coarse comparator comprises a counter connected to said clock source and incremented by a transition of said clock signal, for generating said coarse difference signal.

5. The phase comparator of claim 4, wherein said coarse comparator further comprises a latch connected to an output of said counter and latched by a transition of said reference signal to latch said coarse difference signal.

6. The phase comparator of claim 1, wherein said fine phase comparator comprises a delay line generator for generating a plurality of delayed clock signals, each delayed from another by an interval less than said clock period, and said fine difference signal is provided by sampling said reference signal at transitions of said delayed clock signals.

7. The phase comparator of claim 1, wherein said fine phase comparator comprises a delay line generator for generating a plurality of delayed clock signals, each delayed from another by an interval less than said clock period, and said fine difference signal is provided by sampling said delayed clock signals at a transition of said reference signal.

8. The phase comparator of claim 7, wherein each delayed clock signal is delayed from a previous delayed clock signal by an equal interval, and said clock period is approximately an integer multiple of said equal interval.

9. The phase comparator of claim 7, wherein said combiner comprises an encoder to encode said fine difference signal to a fine numeric value, a multiplier to multiply a number of complete periods counted by said coarse phase comparator by said integer multiple and an adder to add said fine numeric value to form said total difference signal.

10. A phase locked loop for generating an output signal phase locked to a reference signal, comprising
a phase comparator, for generating a difference signal representative of a total phase difference between said reference signal and said output signal;
a variable frequency oscillator connected to said phase comparator to receive said difference signal, said oscillator adapted to generate a clock signal related to said output signal and having a frequency that varies for a non-zero phase difference signal;
an output source for providing said output signal, phase locked to said clock signal, said output source interconnected with one of said comparator and said oscillator;
said phase comparator comprising
a coarse phase comparator providing a coarse difference signal representative of a number of complete periods of said clock signal between transitions of said reference signal and said output signal;
a fine phase comparator providing a fine difference signal representative of a remaining fraction of a clock period between transitions of said reference and output signals; and
a signal combiner to combine said coarse and fine difference signals to generate said total difference signal.

11. The phase locked loop of claim 10, wherein said clock signal is phase-locked to said output signal.

12. The phase-locked-loop of claim 11, wherein said comparator provides digital fine, coarse and total difference signals.

13. The phase locked loop of claim 12, wherein said coarse comparator comprises a counter connected to said clock source and incremented by a transition of said clock signal, for generating said coarse difference signal.

14. The phase locked loop claim 13, wherein said coarse comparator further comprises a latch connected to an output of said counter and latched by a transition of said reference signal to latch said coarse difference signal.

15. The phase locked loop of claim 10, wherein said fine phase comparator comprises a delay line generator for generating a plurality of delayed clock signals, each delayed from another by an interval less than said clock period, and said fine difference signal is formed by sampling said reference signal at transitions of said delayed clock signals.

16. The phase locked loop of claim 10, wherein said fine phase comparator comprises a delay line generator for generating a plurality of delayed clock signals, each delayed from another by an interval less than said clock period, and said fine difference signal is formed by sampling said delayed clock signals at a transition of said reference signal.

17. The phase locked loop of claim 16, wherein each delayed clock signal is delayed from a previous delayed clock signal by an equal interval, and said clock period is approximately an integer multiple of said equal interval.

18. The phase locked loop of claim 17, wherein said coarse comparator comprises a counter, connected to said clock source and incremented by a transition of said clock signal, for generating said coarse difference signal and wherein said combiner comprises
an encoder to encode said fine difference to a fine numeric value;
a multiplier to multiply a value counted by said counter by said integer multiple and an adder to add said fine numeric value to form said total difference signal.

19. The phase locked loop of claim 13, further comprising a digital filter for filtering said difference signal to control said oscillator.

20. A method of determining the phase difference between a first input signal and a second signal, comprising the steps of;
generating a periodic clock signal having a clock period less than a period of said first input signal;
counting a number of full clock periods between a transition of said first input signal and said second signal;
estimating a remaining fraction of a clock period between said transitions of said first input signal and said second signal.

21. The method of claim 20, wherein said clock signal is phase locked to said second signal.

22. The method of claim 21, wherein said remaining fraction is estimated by estimating a phase difference between said clock signal and said first input signal.

23. The method of claim 22, wherein said phase difference is estimated by generating a plurality of delayed clock signals, and determining a transition of said first input signal relative to transitions of said delayed clock signals.

24. A digital phase comparator for generating a difference signal representative of a phase difference between first and second periodic input signals, said comparator comprising,
a clock source providing a periodic clock signal, having a frequency greater than said first and second input signals;
a coarse comparator providing an output signal based on a number of full periods of said clock signal between a transition of said first and second input signals;
a fine phase comparator for producing an output signal representative of a remaining fraction of a clock period between transitions of said first and second input signals;
a signal combiner to combine said output signals of said fine and coarse comparators to form said difference signal.

25. The digital phase comparator of claim 24, wherein said coarse comparator comprises a counter connected to said clock source and incremented by a transition of said clock signal, for generating said coarse difference signal.

26. The digital phase comparator of claim 25, wherein said counter is reset upon sensing a transition of one of said first and second periodic input signals.

27. The digital phase comparator of claim 26, wherein said fine phase comparator comprises a delay line generator for generating a plurality of delayed clock signals, each delayed from another by an interval less than said clock period, and said fine difference signal is formed by sampling at least one of said first and second input signals at transitions of said delayed clock signals.

28. The digital phase comparator of claim 27, wherein said fine phase comparator comprises a delay line generator for generating a plurality of delayed clock signals, each delayed from another by an interval less than said clock period, and said fine difference signal is formed by sampling said delayed clock signals at a transition of at least one of said first and second input signals.

29. The digital phase comparator of claim 28, wherein each delayed clock signal is delayed from a previous delayed clock signal by an equal interval, and said clock period is approximately an integer multiple of said equal interval.

30. The digital phase comparator of claim 29, wherein said signal combiner comprises an encoder to encode said fine difference to a fine numeric value;

a multiplier to multiply a value counted by said counter by said integer multiple and an adder to add said fine numeric value to form said total difference signal.

31. A phase comparator for generating a total difference signal representative of a phase difference between first and second periodic input signals, said comparator comprising, means for providing a periodic clock signal, having a frequency greater than said first and second input signals;

means for producing a first difference signal representative of a number of full periods of said clock signal between transitions of said first input signal and said second input signal;

means for producing a second difference signal representative of a remaining fraction of a clock period between transitions of said first and second input signals;

means for combining said first and second difference signals to form said total difference signal.

32. The phase comparator of claim 2, wherein said clock signal has a frequency at or near an integer multiple of said output signal.

33. The phase locked loop of claim 10, wherein said clock signal has a frequency at or near an integer multiple of said output signal.

34. The method of claim 20, wherein said clock signal has a frequency at or near an integer multiple of said output signal.

35. The phase comparator of claim 31, wherein said clock signal has a frequency at or near an integer multiple of said output signal.

* * * * *